United States Patent
Bazzani et al.

(10) Patent No.: US 10,263,573 B2
(45) Date of Patent: Apr. 16, 2019

(54) DRIVER WITH DISTRIBUTED ARCHITECTURE

(71) Applicant: MACOM Technology Solutions Holdings, Inc., Lowell, MA (US)

(72) Inventors: Cristiano Bazzani, Irvine, CA (US); Matteo Troiani, Irvine, CA (US)

(73) Assignee: MACOM Technology Solutions Holdings, Inc., Lowell, MA (US)

(*) Notice: Subject to any disclaimer, the term of this patent is extended or adjusted under 35 U.S.C. 154(b) by 0 days.

(21) Appl. No.: 15/690,674

(22) Filed: Aug. 30, 2017

(65) Prior Publication Data

US 2018/0062589 A1 Mar. 1, 2018

Related U.S. Application Data

(60) Provisional application No. 62/381,521, filed on Aug. 30, 2016.

(51) Int. Cl.
*H03F 1/56* (2006.01)
*H03F 3/60* (2006.01)
(Continued)

(52) U.S. Cl.
CPC .............. *H03F 1/56* (2013.01); *H03F 1/18* (2013.01); *H03F 1/565* (2013.01);
(Continued)

(58) Field of Classification Search
CPC ... H03F 1/56; H03F 1/18; H03F 1/565; H03F 3/605; H03F 3/607; H04B 10/50; H04B 10/615
(Continued)

(56) References Cited

U.S. PATENT DOCUMENTS 3,661,443 A * 5/1972 Harris .................. G02F 1/0327
330/55
4,534,064 A 8/1985 Giacometti et al.
(Continued)

FOREIGN PATENT DOCUMENTS

EP 606161 4/2000
EP 1471671 12/2004
(Continued)

OTHER PUBLICATIONS

Zhang, Tao, et al., "10-Gb/s Distributed Amplifier-Based VCSEL Driver IC With ESD Protection in 130-nm CMOS", IEEE Transactions on Very Large Scale Integration Systems, vol. 24 Issue 7, Jan. 7, 2016, pp. 2502-2510.
(Continued)

*Primary Examiner* — Oommen Jacob
(74) *Attorney, Agent, or Firm* — Weide & Miller, Ltd.

(57) ABSTRACT

A distributed driver for an optic signal generator has a first amplifier cell with one or more amplifiers configured to receive and amplify an input signal to create a first amplified signal. A second amplifier cell has one or more amplifiers configured to receive and amplify the input signal to create a second amplified signal. A first conductive path and second conductive path connects to the first amplifier cell and the second amplifier cell such that the inductance associated with the first and second conductive path counteracts a capacitance associated with the first amplifier cell and the second amplifier cell. A variable capacitor may be part of the first amplifier cell and/or the second amplifier cell to selectively tune the capacitance of the distributed driver. A distributed bias circuit may be part of the first amplifier cell and/or the second amplifier cell to bias an optic signal transmitter.

22 Claims, 9 Drawing Sheets

(51) Int. Cl.
  *H04B 10/61*   (2013.01)
  *H04B 10/50*   (2013.01)
  *H05B 37/00*   (2006.01)
  *H03F 1/18*    (2006.01)
  *H03F 3/45*    (2006.01)
  *H01S 3/10*    (2006.01)
  *H01S 5/042*   (2006.01)

(52) U.S. Cl.
  CPC ......... *H03F 3/45381* (2013.01); *H03F 3/605* (2013.01); *H03F 3/607* (2013.01); *H04B 10/50* (2013.01); *H04B 10/615* (2013.01); *H01S 3/10007* (2013.01); *H01S 5/0427* (2013.01); *H03F 2200/12* (2013.01); *H03F 2200/387* (2013.01)

(58) Field of Classification Search
  USPC .................................................. 398/202, 188
  See application file for complete search history.

(56) References Cited

U.S. PATENT DOCUMENTS

| | | | |
|---|---|---|---|
| 4,545,078 A | 10/1985 | Wiedeburg | |
| 4,687,924 A | 8/1987 | Galvin et al. | |
| 4,709,416 A | 11/1987 | Patterson | |
| 4,734,914 A | 3/1988 | Yoshikawa | |
| 4,747,091 A | 5/1988 | Doi | |
| 4,772,859 A * | 9/1988 | Sakai | H03F 1/302 330/308 |
| 4,864,649 A | 9/1989 | Tajima et al. | |
| 5,019,769 A | 5/1991 | Levinson | |
| 5,039,194 A | 8/1991 | Block et al. | |
| 5,047,835 A | 9/1991 | Chang | |
| 5,057,932 A | 9/1991 | Lang | |
| 5,289,302 A | 2/1994 | Eda | |
| 5,334,826 A | 8/1994 | Sato et al. | |
| 5,355,422 A * | 10/1994 | Sullivan | G02F 1/0356 385/1 |
| 5,361,038 A * | 11/1994 | Allen | H03F 3/607 330/147 |
| 5,383,046 A | 1/1995 | Tomofuji et al. | |
| 5,383,208 A | 1/1995 | Queniat et al. | |
| 5,392,273 A | 1/1995 | Masaki et al. | |
| 5,394,416 A | 2/1995 | Ries | |
| 5,396,059 A | 3/1995 | Yeates | |
| 5,448,629 A | 9/1995 | Bosch et al. | |
| 5,471,501 A | 11/1995 | Parr et al. | |
| 5,488,627 A | 1/1996 | Hardin et al. | |
| 5,491,548 A | 2/1996 | Bell et al. | |
| 5,510,924 A | 4/1996 | Terui et al. | |
| 5,532,471 A | 7/1996 | Khorramabadi et al. | |
| 5,550,513 A * | 8/1996 | Wong | H03F 3/605 330/286 |
| 5,557,437 A | 9/1996 | Sakai et al. | |
| 5,574,435 A | 11/1996 | Mochizuki et al. | |
| 5,636,254 A | 6/1997 | Hase et al. | |
| 5,673,282 A | 9/1997 | Wurst | |
| 5,710,660 A | 1/1998 | Yamamoto et al. | |
| 5,796,501 A | 8/1998 | Sotom et al. | |
| 5,812,572 A | 9/1998 | King et al. | |
| 5,822,099 A | 10/1998 | Takamatsu | |
| 5,844,928 A | 12/1998 | Shastri et al. | |
| 5,880,640 A * | 3/1999 | Dueme | H03F 3/607 330/179 |
| 5,900,959 A | 5/1999 | Noda et al. | |
| 5,926,303 A | 7/1999 | Giebel et al. | |
| 5,943,152 A | 8/1999 | Mizrahi et al. | |
| 5,953,690 A | 9/1999 | Lemon et al. | |
| 5,956,168 A | 9/1999 | Levinson et al. | |
| 5,978,393 A | 11/1999 | Feldman et al. | |
| 6,010,538 A | 1/2000 | Sun et al. | |
| 6,014,241 A | 1/2000 | Winter et al. | |
| 6,020,593 A | 2/2000 | Chow et al. | |
| 6,021,947 A | 2/2000 | Swartz | |
| 6,023,147 A | 2/2000 | Cargin, Jr. et al. | |
| 6,049,413 A | 4/2000 | Taylor et al. | |
| 6,055,252 A * | 4/2000 | Zhang | H01S 5/068 372/26 |
| 6,064,258 A * | 5/2000 | Shulman | H03F 1/0277 330/253 |
| 6,064,501 A | 5/2000 | Roberts et al. | |
| 6,081,362 A | 6/2000 | Hatakeyama et al. | |
| 6,108,113 A | 8/2000 | Fee | |
| 6,111,687 A | 8/2000 | Tammela | |
| 6,115,113 A | 9/2000 | Flockencier | |
| H1881 H | 10/2000 | Davis et al. | |
| 6,160,647 A | 12/2000 | Gilliland et al. | |
| 6,175,434 B1 | 1/2001 | Feng | |
| 6,259,293 B1 | 7/2001 | Hayase et al. | |
| 6,262,781 B1 | 7/2001 | Deter | |
| 6,282,017 B1 | 8/2001 | Kinoshita | |
| 6,292,497 B1 | 9/2001 | Nakano | |
| 6,333,895 B1 | 12/2001 | Hamamoto et al. | |
| 6,366,373 B1 | 4/2002 | MacKinnon et al. | |
| 6,388,784 B1 | 5/2002 | Nakamura et al. | |
| 6,397,090 B1 | 5/2002 | Cho | |
| 6,423,963 B1 | 7/2002 | Wu | |
| 6,452,719 B2 | 9/2002 | Kinoshita | |
| 6,473,224 B2 | 10/2002 | Dugan et al. | |
| 6,494,370 B1 | 12/2002 | Sanchez | |
| 6,512,617 B1 | 1/2003 | Tanji et al. | |
| 6,535,187 B1 | 3/2003 | Wood | |
| 6,556,601 B2 | 4/2003 | Nagata | |
| 6,570,944 B2 | 5/2003 | Best et al. | |
| 6,580,328 B2 | 6/2003 | Tan et al. | |
| 6,657,488 B1 | 12/2003 | King et al. | |
| 6,661,940 B2 | 12/2003 | Kim | |
| 6,704,008 B2 | 3/2004 | Naito et al. | |
| 6,707,600 B1 | 3/2004 | Dijaili et al. | |
| 6,720,826 B2 * | 4/2004 | Yoon | H03F 3/082 250/214 A |
| 6,738,578 B1 | 5/2004 | Mihota | |
| 6,740,864 B1 | 5/2004 | Dries | |
| 6,759,907 B2 * | 7/2004 | Orr | H03F 1/18 330/286 |
| 6,798,281 B2 * | 9/2004 | Dueme | H03F 1/22 330/286 |
| 6,801,555 B1 | 10/2004 | Dijaili et al. | |
| 6,828,857 B2 | 12/2004 | Paillet et al. | |
| 6,836,185 B1 * | 12/2004 | Pobanz | G02F 1/0327 330/260 |
| 6,836,493 B2 | 12/2004 | Mahowald et al. | |
| 6,837,625 B2 | 1/2005 | Schott et al. | |
| 6,852,966 B1 | 2/2005 | Douma et al. | |
| 6,862,047 B2 | 3/2005 | Hibi | |
| 6,864,751 B1 | 3/2005 | Schmidt et al. | |
| 6,868,104 B2 | 3/2005 | Stewart et al. | |
| 6,879,217 B2 | 4/2005 | Visocchi | |
| 6,888,123 B2 | 5/2005 | Douma et al. | |
| 6,909,731 B2 | 6/2005 | Lu | |
| 6,934,307 B2 | 8/2005 | DeCusatis et al. | |
| 6,934,479 B2 | 8/2005 | Sakamoto et al. | |
| 6,941,077 B2 | 9/2005 | Aronson et al. | |
| 6,952,531 B2 | 10/2005 | Aronson et al. | |
| 6,956,643 B2 | 10/2005 | Farr et al. | |
| 6,957,021 B2 | 10/2005 | Aronson et al. | |
| 6,967,320 B2 | 11/2005 | Chieng et al. | |
| 7,005,901 B1 | 2/2006 | Jiang et al. | |
| 7,031,574 B2 | 4/2006 | Huang et al. | |
| 7,039,082 B2 | 5/2006 | Stewart et al. | |
| 7,046,721 B2 | 5/2006 | Grohn | |
| 7,049,759 B2 | 5/2006 | Roach | |
| 7,050,720 B2 | 5/2006 | Aronson et al. | |
| 7,058,310 B2 | 6/2006 | Aronson et al. | |
| 7,066,746 B1 | 6/2006 | Togami et al. | |
| 7,079,775 B2 | 7/2006 | Aronson et al. | |
| 7,127,391 B2 | 10/2006 | Chang et al. | |
| 7,145,928 B1 | 12/2006 | Maxim | |
| 7,184,671 B2 | 2/2007 | Wang | |
| 7,193,957 B2 | 3/2007 | Masui et al. | |
| 7,206,023 B2 | 4/2007 | Belliveau | |
| 7,215,891 B1 | 5/2007 | Chiang et al. | |

(56) References Cited

U.S. PATENT DOCUMENTS

| | | | |
|---|---|---|---|
| 7,233,206 B2 | 6/2007 | Murakami et al. | |
| 7,265,334 B2 | 9/2007 | Draper et al. | |
| 7,269,194 B2 | 9/2007 | Diaz et al. | |
| 7,276,682 B2 | 10/2007 | Draper et al. | |
| 7,286,726 B1* | 10/2007 | Keil | G02F 1/0121 385/1 |
| 7,315,206 B2* | 1/2008 | Leyten | H03F 1/18 330/43 |
| 7,357,513 B2 | 4/2008 | Watson et al. | |
| 7,381,935 B2 | 6/2008 | Sada et al. | |
| 7,403,064 B2 | 7/2008 | Chou et al. | |
| 7,453,475 B2 | 11/2008 | Nitta et al. | |
| 7,504,610 B2 | 3/2009 | Draper | |
| 7,505,497 B2* | 3/2009 | Xu | H04B 10/503 372/29.015 |
| 7,692,417 B2 | 4/2010 | Dagher | |
| 7,741,908 B2 | 6/2010 | Furuta | |
| 7,804,357 B2* | 9/2010 | Shigematsu | H03F 3/3001 330/262 |
| 8,094,692 B2 | 1/2012 | Nakamura | |
| 8,274,335 B1* | 9/2012 | Chatwin | H03F 3/08 330/308 |
| 8,837,542 B1* | 9/2014 | Yang | H01S 5/0427 372/29.01 |
| 9,065,407 B2* | 6/2015 | Zou | H03G 3/004 |
| 9,088,122 B2* | 7/2015 | Moto | H01S 5/0265 |
| 9,151,604 B1* | 10/2015 | Dunne | G01C 3/08 |
| 9,419,410 B2 | 8/2016 | Usuki | |
| 9,698,023 B2* | 7/2017 | Itabashi | H01L 21/2885 |
| 2001/0046243 A | 1/2001 | Schie | |
| 2002/0015305 A1 | 2/2002 | Bornhorst et al. | |
| 2002/0085600 A1 | 7/2002 | Jung | |
| 2002/0097467 A1 | 7/2002 | Terahara et al. | |
| 2002/0105982 A1 | 8/2002 | Chin et al. | |
| 2002/0130977 A1 | 9/2002 | Hibi | |
| 2002/0140378 A1 | 10/2002 | Volk et al. | |
| 2002/0181823 A1* | 12/2002 | Ibukuro | G02F 1/0327 385/3 |
| 2003/0030756 A1 | 2/2003 | Kane et al. | |
| 2003/0043869 A1 | 3/2003 | Vaughan | |
| 2003/0053003 A1 | 3/2003 | Nishi et al. | |
| 2003/0067662 A1 | 4/2003 | Brewer et al. | |
| 2003/0112075 A1* | 6/2003 | Betti-Berutto | H03F 1/18 330/295 |
| 2003/0122057 A1 | 7/2003 | Han et al. | |
| 2003/0151396 A1* | 8/2003 | Self | G05F 3/262 323/312 |
| 2004/0032890 A1 | 2/2004 | Murata | |
| 2004/0047635 A1 | 3/2004 | Aronson et al. | |
| 2004/0091005 A1* | 5/2004 | Hofmeister | H01S 5/042 372/34 |
| 2004/0095976 A1 | 5/2004 | Bowler et al. | |
| 2004/0101007 A1* | 5/2004 | Bozso | H01S 5/0428 372/38.02 |
| 2004/0114650 A1 | 6/2004 | Tanaka | |
| 2004/0136727 A1 | 7/2004 | Androni et al. | |
| 2004/0160996 A1 | 8/2004 | Giorgi | |
| 2004/0208526 A1 | 10/2004 | Mibu | |
| 2004/0240041 A1 | 12/2004 | Tian et al. | |
| 2005/0024023 A1* | 2/2005 | Chang | H02M 1/4216 323/207 |
| 2005/0024142 A1 | 2/2005 | Sowlati | |
| 2005/0062530 A1 | 3/2005 | Bardsley et al. | |
| 2005/0147136 A1* | 7/2005 | Pobanz | G02F 1/0121 372/26 |
| 2005/0180280 A1 | 8/2005 | Hoshino et al. | |
| 2005/0185149 A1 | 8/2005 | Lurkens et al. | |
| 2005/0215090 A1 | 9/2005 | Harwood | |
| 2005/0243879 A1 | 11/2005 | Horiuchi | |
| 2005/0265709 A1* | 12/2005 | Kim | G03B 15/05 396/205 |
| 2006/0114954 A1 | 6/2006 | Wong et al. | |
| 2006/0125557 A1 | 6/2006 | Manstretta | |
| 2006/0192899 A1 | 8/2006 | Ogita | |
| 2006/0239308 A1 | 10/2006 | Husain | |
| 2006/0261893 A1 | 11/2006 | Chiang et al. | |
| 2006/0280211 A1 | 12/2006 | Garez | |
| 2007/0058089 A1 | 3/2007 | Wang | |
| 2007/0081130 A1 | 4/2007 | May et al. | |
| 2007/0098026 A1 | 5/2007 | Uesaka et al. | |
| 2007/0159434 A1 | 7/2007 | Yen et al. | |
| 2007/0195208 A1 | 8/2007 | Miyazawa et al. | |
| 2007/0202215 A1 | 8/2007 | Lak | |
| 2007/0229718 A1 | 10/2007 | Hall | |
| 2007/0263685 A1 | 11/2007 | Takasou | |
| 2007/0286609 A1 | 12/2007 | Ikram et al. | |
| 2008/0012508 A1 | 1/2008 | Steele et al. | |
| 2008/0024469 A1 | 1/2008 | Damera-Venkata et al. | |
| 2008/0055005 A1 | 3/2008 | Nam et al. | |
| 2008/0068066 A1* | 3/2008 | Mittal | H05B 33/0815 327/535 |
| 2008/0074562 A1 | 3/2008 | Endo et al. | |
| 2008/0231209 A1 | 9/2008 | Shiwaya et al. | |
| 2008/0246893 A1 | 10/2008 | Boss et al. | |
| 2008/0303499 A1 | 12/2008 | Chen et al. | |
| 2008/0309407 A1 | 12/2008 | Nakamura et al. | |
| 2009/0148094 A1 | 6/2009 | Kucharski et al. | |
| 2009/0238226 A1 | 9/2009 | Moto | |
| 2009/0243717 A1* | 10/2009 | Bonthron | H03F 3/45089 330/10 |
| 2009/0268767 A1 | 10/2009 | Nelson | |
| 2010/0102884 A1* | 4/2010 | Takaso | H03F 3/45085 330/252 |
| 2010/0164396 A1 | 7/2010 | Lindeberg et al. | |
| 2010/0172384 A1 | 7/2010 | Groepl | |
| 2010/0183318 A1 | 7/2010 | Tanaka | |
| 2011/0062874 A1 | 3/2011 | Knapp | |
| 2011/0069960 A1* | 3/2011 | Knapp | H04L 12/43 398/103 |
| 2011/0147596 A1* | 6/2011 | Ishida | H01L 27/14659 250/366 |
| 2011/0227648 A1* | 9/2011 | Mohammadi | H03F 3/426 330/253 |
| 2011/0227649 A1* | 9/2011 | Montalvo | H03F 3/195 330/254 |
| 2012/0201260 A1 | 8/2012 | Nguyen et al. | |
| 2012/0299660 A1* | 11/2012 | Arkiszewski | H03F 1/0227 330/296 |
| 2013/0050289 A1* | 2/2013 | Kang | G09G 3/342 345/690 |
| 2013/0070796 A1* | 3/2013 | Belloni | H05B 33/0815 372/38.01 |
| 2013/0229699 A1* | 9/2013 | Tatsumi | G02F 1/0121 359/238 |
| 2014/0023374 A1 | 1/2014 | Yuda | |
| 2014/0118083 A1* | 5/2014 | Shastry | H03H 11/0466 333/129 |
| 2014/0226147 A1 | 8/2014 | Metzler | |
| 2014/0233594 A1 | 8/2014 | Tatsuo | |
| 2014/0320212 A1 | 10/2014 | Kalantari et al. | |
| 2015/0229408 A1* | 8/2015 | Ding | H04B 10/541 398/188 |
| 2015/0295547 A1* | 10/2015 | Blednov | H03F 1/0288 330/286 |
| 2016/0065149 A1* | 3/2016 | Shaw | H03F 3/45179 330/261 |
| 2016/0070123 A1* | 3/2016 | Tatsumi | G02F 1/0121 359/276 |
| 2016/0072462 A1 | 3/2016 | Itabashi et al. | |
| 2017/0054510 A1* | 2/2017 | Zortea | H04B 10/516 |
| 2017/0371363 A1* | 12/2017 | Habu | G05F 1/561 |
| 2018/0062589 A1* | 3/2018 | Bazzani | H03F 1/18 |

FOREIGN PATENT DOCUMENTS

| | | |
|---|---|---|
| EP | EP 2249492 | 11/2010 |
| JP | 58140175 | 8/1983 |
| JP | 62124576 | 6/1987 |
| JP | 62235975 | 10/1987 |
| JP | 62281485 | 12/1987 |
| JP | 05152660 | 6/1993 |

(56) References Cited

FOREIGN PATENT DOCUMENTS

| JP | 2001-119250 | 4/2001 |
|---|---|---|
| JP | 2004-045989 | 2/2004 |
| WO | WO 93/21706 | 10/1993 |
| WO | WO 02/063800 | 8/2002 |
| WO | WO 2004/098100 | 11/2004 |

OTHER PUBLICATIONS

Single-Ended vs. Differential Methods of Driving a Laser Diode, Maxim Integrated TM, Application Note: HFAN-2.5.0, Rev. 5; Oct. 2008, 5 pages.
Miller Effect—Wikipedia, the free encyclopedia, http://en.wikipedia.org/wiki/Miller_effect, Mar. 9, 2015.
Yuan, 2007, Springer, XVIII, pp. 20-21.
Analog Devices, Background information about wireless communications. Date unknown, http://rf.rfglobalnet.com/library/applicationnotes/files/7/bginfo.htm, 8 pages.
A Low Noise, Wide Dynamic Range, Transimpedance Amplifier with Automatic Gain Control for SDH/SONET (STM16/OC48) in a 30GHz ft BiCMOS Process, Mihai A. T., Sanduleanu, Philips Research Eindhoven, Paul Manteman, Philips Semiconductors Nijmegen, Sep. 19, 2001, 19 pages.
"PLL Design", http://members.innet.net.au/~richardh/PPH.htm, 9pages.
"LCT3454-1A Synchronous Buck-Boost High Current LED Driver" *Linear Technology*, http://www.linear.com/product/LTC3454@Linear Technology, 12 pages.
Garth Nash, "AN535 Application Notes-Phase-Locked Loop Design Fundamentals", Motorola, Inc., 1994, 3 pages.
Jamie Bailey "How DVD Works", http://sweb.uky.edu/~jrbai101/dvd.htm, May 1, 1999, pages.
Tuan "Solace" Nguyen, "CD, CD-R, CD-RW, DVD, DD-RAM, DVD-RW, and MO", Tweak3D.Net-Your Freakin' Tweakin Source!, http://www.tweak3d.net/articles/opticals/, May 13, 2000, 7 pages.
"An Introduction to DVD-RW", DVD White Paper, Pioneer New Media Technologies, Inc., Feb. 8, 2001, 8 pages.
Ron Bertrand, "The Basics of PLL Frequency Synthesis", Online Radio & Electronics Course, Apr. 2002, 9 pages.
Richard Wilkinson "Topic: Selecting the Right DVD Mastering Technique", DVD Technology Update, http://www.optical-disc.com/dvdupdate.html, 2002, 8 pages.
Dr. John Rilum, "Mastering Beyond DVD Density", http://www.optical-disc.com/beyonddvd.html, 2002, 7 pages.
"CD Basics: The Bumps", Howstuffworks "How CD Burners Work", http://entertainment.howstuffworks.com/cd-burner1.htm, 2004, 3 pages.
Keith Szolusha, "Linear Technology Design Notes DC/DC Converter Drives Lumileds White LEDs from a Variety of Power Sources-Design Note 340", Linear Technology Corporation, © Linear Technology Corporation 2004, date unknown, 2 pages.
"An Introduction to DVD Recordable (DVD-R) What is DVD Recordable?" http://www.dvd-copy.com/reference/dvd_recordable.html, 2004, 8 pages.
"Power Management, LED-driver considerations" Analog and Mixed-Signal Products, Analog Applications Journal, www.ti.com/sc/analogapps, Texas Instruments Incorporated, © 2005 Texas Instruments Incorporated, Michael Day, 5 pages.
"Linear Technology LCT 3533 2A Wide Input Voltage Synchronous Buck-Boost DC/DC Converter", © Linear Technology Corporation 2007, 16 pages.
"National Semiconductor LM 3549 High Power Sequential LED Driver", © 2010 National Semiconductor Corporation, www.national.com, Aug. 3, 2010, 20 pages.
"TPS63020 TPS63021 High Efficiency Single Inductor Buck-Boost Converter With 4-A Switches", Texas Instruments, Copyright © 2010, Texas Instruments Incorporated, Apr. 2010, 28 pages.
"LT3476-High Current Quad Output LED Driver" *Linear Technology*, http://www.linear.com/product/LT3476, @2010 Linear Technology, 14 pages.
"Current mirror" *Wikipedia, the free encyclopedia*, http://en.wikipedia.org/wiki/Current_mirror, May 22, 2011, 8 pages.
"Mosfet"*Wikipedia, the free encyclopedia*, http://en.wikipedia.org/wiki/MOSFET, May 27, 2011, 24 pages.
Abhijit Phanse, National Semiconductor, "Exercise 2: Define the time variance of a fiber optic channel's Impulse Response, and suggest a method for measuring it", IEEE 802.3ae, Nov. 2000, 13 pages.

* cited by examiner

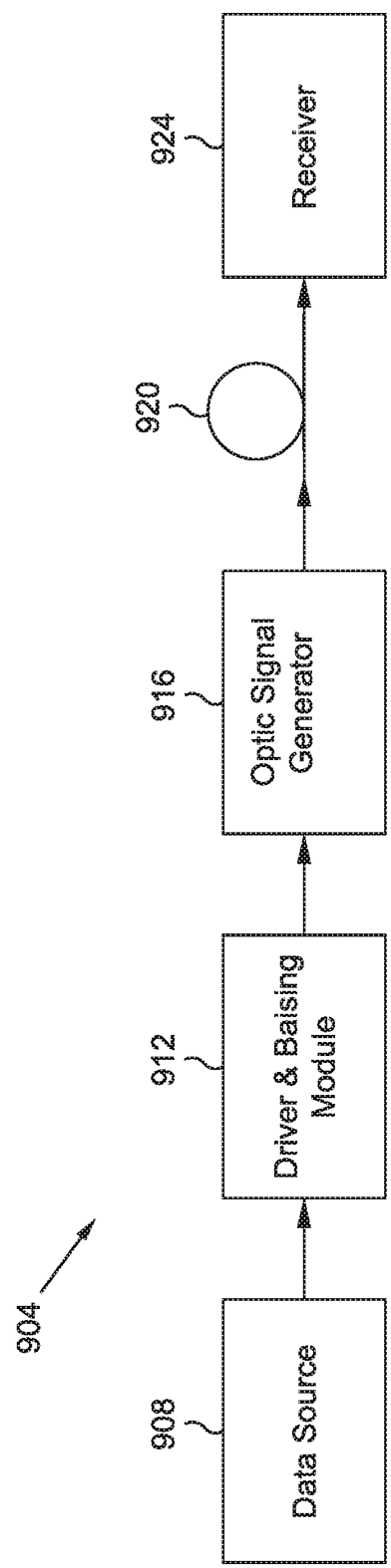

DRIVER WITH DISTRIBUTED ARCHITECTURE

PRIORITY CLAIM

This application claims priority to and the benefit of U.S. Provisional Patent Application 62/381,521 filed on Aug. 30, 2016 titled Driver with Distributed Architecture.

FIELD OF THE INVENTION

This innovation relates to drivers for optic signal generators and in particular to an apparatus and method for implementing a distributed amplifier with optional distributed biasing cells.

RELATED ART

Numerous devices utilize optic signal generators to create an optic signal. Optic based communication systems are one exemplary environment of use that utilize optic signal generators, such as lasers, light emitting diodes or silicon photonics systems. Optic based communication systems transmit and receive optic signals, which represent data, over a fiber optic cable. The data is processed by a transmitter to a format suitable for transmission as an optic signal and thereafter a driver amplifies the data signal to a level suitable to driver the optic signal generator.

Output return loss (ORL) of the associated driver is a critical requirement for high frequency operation as the input return loss (IRL) of these optical signal generators is not well controlled in general so matching the ORL of the driver to the board impedance helps minimize reflections and optimize signal quality. This is particularly evident in a direct modulated laser (DML) driver whose impedance is in the order of few Ohms making it difficult and not practical in terms of power dissipation to match it with that of the driver and the board traces. In addition, the characteristics of the optical signal generator can change over time, or from manufacture to manufacture, and even from one manufacturing run to the next by the same manufacture. These changes over time, or from device to device, in view of the output return loss requirements, present challenges when designing and implementing optic based communication systems because changes over time or between devices degrade impedance matching and therefore signal quality.

Prior art attempts to optimize ORL include use of a matching network using resistors, capacitors, inductors or a combination thereof to minimize output return loss. While this provide some benefit at lower frequencies or for bandpass applications, it does not solve the prior art problems with broadband applications which include high frequency signals. For example, too high of a capacitance of the driver/laser reduces or inhibits operation at high frequency. Therefore, there is a need in the art for matching impedance and obtaining as close as possible to ideal output return loss (ORL) for drivers and biasing systems for optical signal generators, such as a transmitting laser or any other type of optical modulator.

SUMMARY

To overcome the drawbacks of the prior art, a distributed driver for an optic signal generator comprising a driver input configured to receive an input signal and an output configured to provide an output signal to the optic signal generator. A distributed driver for an optic signal generator is disclosed that has two or more amplifier cells. The cells have an amplifier cell input configured to receive the input signal, one or more amplifiers configured to amplify the received signal to create an amplified signal, and an amplifier cell output. Also part of this embodiment is a input path that connects to the amplifier cell input to receive the input signal and distribute the input signal to the two or more amplifier cells. The input path includes one or more inductors that cancel parasitic capacitance from the two or more amplifier cells. A output path connects to the amplifier cell output of the two or more amplifier cells to receive the amplified signal. The output path includes one or more inductors that cancel parasitic capacitance from the two or more amplifier cells.

It is contemplated that an inductor from the input path and an inductor from the output path may be associated with each amplifier cell. In one embodiment, the combination of the amplifier parasitic capacitance and the inductors in the input path and the output path form a transmission line that tunes out the parasitic capacitance of the two or more amplifiers. This embodiment may also include one or more variable capacitors that are part of one or more amplifier cells such that the variable capacitors are configured to tune a capacitance of one or more amplifier cells to optimize output return loss. The distributed driver further includes a biasing cell connected to each amplifier cell such that the biasing cell distributes a biasing cell capacitance to each amplifier cell and the one or more inductors cancel the biasing cell capacitance.

Described another way and in an alternatively embodiment, a first amplifier cell includes a first amplifier cell input, one or more amplifiers, and a first amplifier cell output. The first amplifier cell is configured to receive and amplify the input signal to create a first amplified signal on the first amplifier cell output. A second amplifier cell includes a second amplifier cell input, one or more amplifiers, and a second amplifier cell output. The second amplifier cell is configured to receive and amplify the input signal to create a second amplified signal on the second amplifier cell output. Also part of this embodiment is a first conductive path and a second conductive path. The first conductive path connects the driver input to the first amplifier cell input and the second amplifier cell input. The first conductive path carries the input signal to the first amplifier cell and the second amplifier cell such that an inductance of the first conductive path counteracts a capacitance associated with the first amplifier cell and the second amplifier cell. The second conductive path connects the driver output to the first amplifier cell output and the second amplifier cell output. Additional amplifier cells may be added, such as the four shown in the figures, or any number subject to the particular application and that the capacitance of the amplifier cells cancelled or tuned out with the inductors to optimize output return loss.

The second conductive path carries the first amplified signal and the second amplifier signal to the driver output, such that an inductance of the second conductive path counteracts the capacitance associated with the first amplifier cell and the second amplifier cell. A first variable capacitor in located in the first amplifier cell and is configured to selectively tune the capacitance of the first amplifier cell. Likewise, a second variable capacitor is located in the second amplifier cell and is configured to selectively tune the capacitance of the second amplifier cell. Also part of this embodiment is a first and second bias cell. The first bias cell is connected to the first amplifier cell and is configured to bias the optic signal generator while the second bias cell connects to the second amplifier cell and is configured to bias the optic signal generator.

In one embodiment, the first conductive path includes one or more inductors and the second conductive path includes one or more inductors. The distributed driver may be configured as a differential pair. The driver may further comprise additional amplifiers cells having a configuration that is the same as the first amplifier cell and the second amplifier cell. In one configuration one or more termination resistors connect to the first conductive path and one or more termination resistors connect to the second conductive path. It is contemplated that the first bias cell and the second bias cell do not include or require an inductor located on a circuit board.

Also disclosed herein is a distributed driver for an optic signal generator comprising driver input configured to receive an input signal and an output configured to provide an output signal to the optic signal generator. A first amplifier cell is configured to receive and amplify the input signal to create a first amplified signal while a second amplifier cell is configured to receive and amplify the input signal to create a second amplified signal. Also part of this embodiment is a first conductive path and a second conductive path. The first conductive path connects the driver input to the first amplifier cell and the second amplifier cell. An inductance is part of the first conductive path and it counteracts a capacitance of the first amplifier cell and the second amplifier cell. Similarly, the second conductive path connects the driver output to the first amplifier cell output and the second amplifier cell output. The second conductive path provides the first amplified signal and the second amplified signal to the driver output, such that an inductance that is part of the second conductive path counteracts the capacitance of the first amplifier cell and the second amplifier cell.

In one embodiment, the first conductive path includes one or more inductors and the second conductive path includes one or more inductors. The distributed driver may be configured as a differential pair. This driver may include a first variable capacitor in the first amplifier cell that is configured to selectively tune the capacitance of the first amplifier cell and a second variable capacitor in the second amplifier cell configured to selectively tune the capacitance of the second amplifier cell. In one configuration, a first bias cell is connected to the first amplifier cell. The first bias cell is configured to bias the optic signal generator. A second bias cell is connected to the second amplifier cell such that the second bias cell is configured to bias the optic signal generator.

In one embodiment, additional amplifier cells are included. It is contemplated that one or more termination resistors may connect to the first conductive path and one or more termination resistors may connect to the second conductive path. In one variation, the first bias cell and the second bias cell do not have an inductor located on a circuit board. The optic signal generator may be a laser or any other type of optical modulator Also disclosed herein is a method for amplifying, with a distributed amplifier, a received signal for driving an optic signal generator. This method includes receiving an input signal that is to be transmitted on an optic fiber as an optic signal and then distributing the input signal to two or more amplifier cells over an input path having an inductance. The input path inductance cancels a parasitic capacitance of the two or more amplifier cells. Then, amplifying the input signal with the two or more amplifier cells to generate amplified output signals and combining the amplified output signals from the two or more amplifiers on an output path. The output path has an inductance that cancels a parasitic capacitance of the two or more amplifier cells. The amplified output signal is provided on an output from the distributed amplifier such that the output connects to the output path.

In one embodiment, this method further includes biasing the optic signal generator with two or more bias cells which are distributed such that two or more amplifier cells have at least one bias cell. In one configuration, the step of biasing the optic signal generator occurs without use of an inductor external to the integrated circuit chip which is located on a circuit board. The step of biasing the optic signal generator distributes capacitance associated with the two or more bias cells to the two or more amplifiers, the input path, and the output path. This method may further comprise adding a variable amount of capacitance to at least one of the two or more amplifier cells. The amount of variable capacitance is adjusted to ensure that the output return loss (ORL) of the driver matches the desire Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 9 illustrates a block diagram of an example environment of use.

DETAILED DESCRIPTION

To improve performance and overcome the drawbacks of the prior art, a distributed amplifier and biasing architecture is disclosed for use in silicon technology and other technologies.

Figure 1:
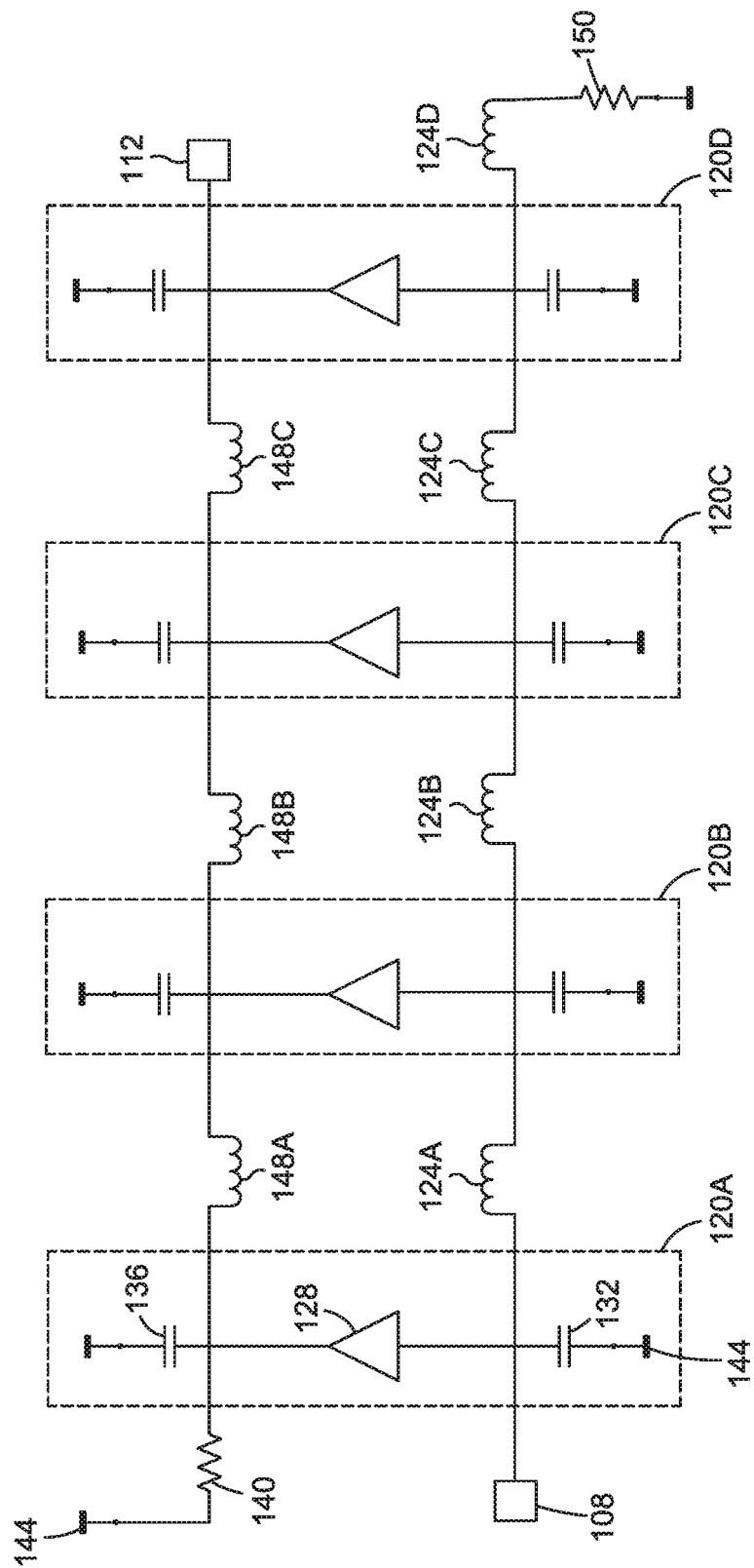
FIG. 1 is a block diagram illustrating an example embodiment of a distributed driver.

FIG. 1 illustrates a block diagram of an exemplary distributed amplifier. A singled ended arrangement is shown. The laser driver 104 includes an input node 108 and an output node 112. The input node 108 receives an outgoing electrical signal to be transmit as an optic signal. In one embodiment, the input node receives data for high speed transmission over the optic fiber. The output node 112 connects to a conductor, such as a trace that provides the output signal to an optic signal generator. The path between the output node 112 and the optic signal generator may be defined as a transmission line.

Connected to the input node 108 is a first gain stage 120A and a first stage inductor 124. A capacitance, shown as capacitor 132, 136, associated with each amplifier cell 120A is parasitic and is part of the first gain stage, and thus not a separate element. This arrangement repeats through one or more additional gain stages 120B, 120C, 120D as shown. Four exemplary gain stages are shown in FIG. 1 but in other embodiment a great or lesser number of gain stages may be implemented subject to the amount of gain required to drive the optic signal generator.

Each amplifier stage (driver stage) may comprise two or more drivers. The drivers may be single ended or differential. As shown, more than one gain cell, that is shown as circuit blocks, amplify an input signal. In the following description input and output of a circuital block will be described as with single ended or differential, but the same concepts and features can be easily applied to single ended or differential input/outputs.

As shown in FIG. 1, the input of a first gain cell 120A is connected to the input of a second gain cell 120B through a first inductor 124A or a transmission line, the input of the second gain cell 120B is connected to the input of a third gain cell 120C through a second inductor 124B or a transmission line and so on through the fourth gain cell 120D and inductor 123C. The inductors may be actual elements, or inductance that is part of or built into the conductive path. The input of the last gain cell 120D is connected to a termination element 150 directly or through an inductor/transmission line 124D as shown. The termination element 150 can be a resistor or any other more complicated structure that is typically known in the field.

The input node 108 of the first gain cell 120A is connected to the output of a pre-driver directly (as shown) or through an inductor/transmission line. The output of the first gain cell 120A is connected to the output of the second gain cell 120B through another inductor 148A or a transmission line, the output of the second gain cell 120B is connected to the output of the third gain cell 120C through another inductor 148B or a transmission line. The output of the third gain cell 120C is connected to the output of the fourth gain cell 120D through another inductor 148C or a transmission line. The output of the last gain cell 120D is connected to output node 112 directly (as shown) or through an inductor/transmission line. The output node 112 connects to the optic signal generator, such as a laser. In other embodiments, a greater or fewer number of amplifier (gain) cell may be implemented.

The output of the first gain cell 120A is connected to a termination element 140 directly (as shown) or through an inductor/transmission line. Termination resistors 140, 150 are associated with the first gain cell (amplifier stage) 120A and the last gain cell (amplifier stage) 120D. In other embodiments, additional resistor may be placed in the driver circuit. The resistors 140, 150 may be selected based on various design constrains and preferences such as power consumption, maximum operating frequency, input and output impedance, and the load. The resistance typically ranges from 20 ohms to 100 ohms but are driven and determined by system requirements. The signal propagates through the gain cells 120A, 120B, 120C, 120D towards the output node 112.

Figure 2:
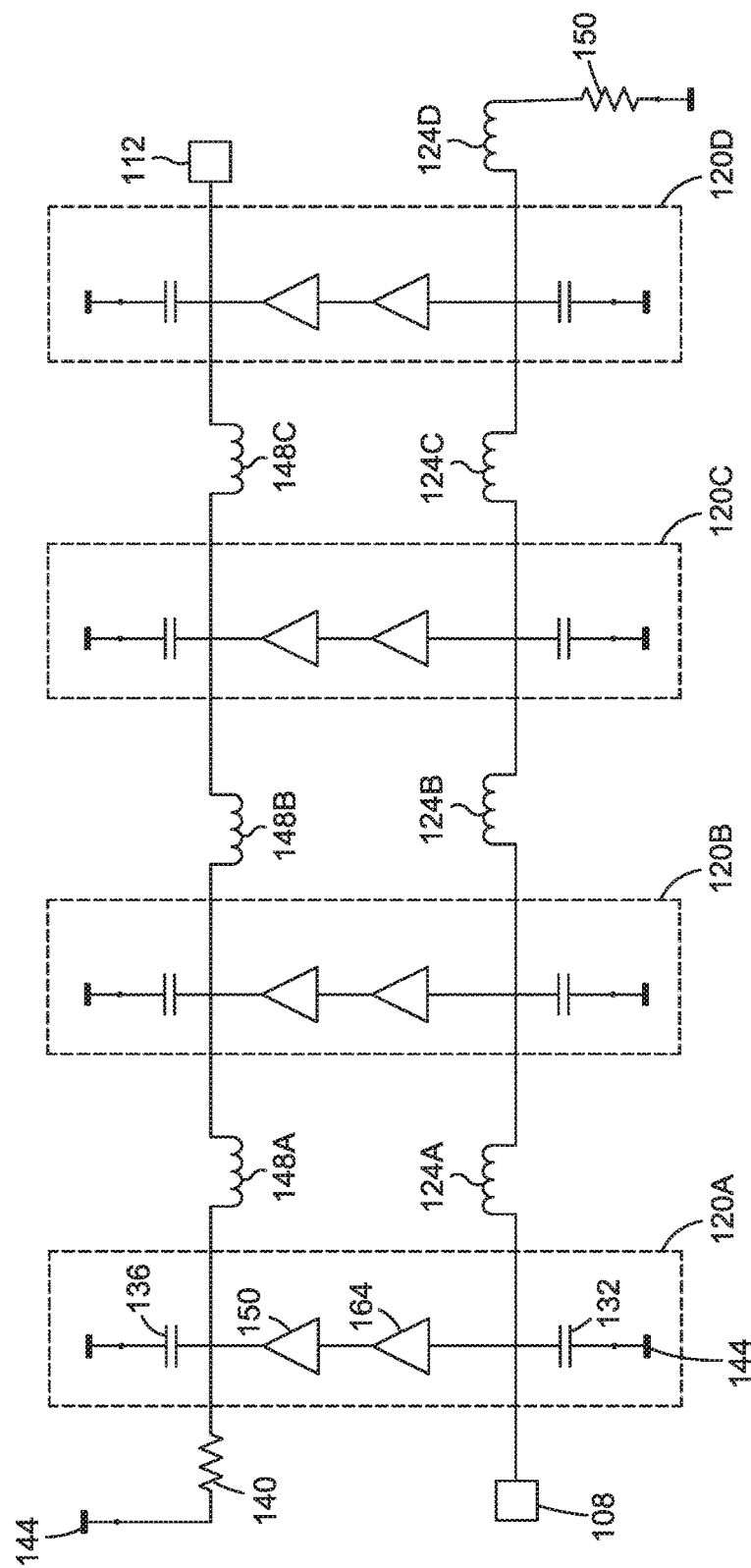
FIG. 2 illustrates a multiple amplifier configuration for input to output isolation and oscillation reduction.

FIG. 2 illustrates an example embodiment of a driver with multiple amplifiers per gain cell. As compared to FIG. 1, similar elements are identified with identical reference numbers. Only the aspects of FIG. 2 that differ from FIG. 1 are described in detail. The discussion of FIG. 1 is repeated and incorporated for FIG. 2. As shown, in each cell 120A, 120B, 120C and 120D (collectively 120), two or more amplifiers are provided. Any number of amplifiers may be provided to establish the gain and other circuit parameters as required. It is also contemplated that each cell 120 may have the same number of amplifiers or a different number. This arrangement shown in FIG. 2 may be established as single ended or in a differential pair configuration. When arranged as a differential arrangement, each of the two or more amplifiers or stages includes one differential pair amplifiers. In other embodiments, additional differential pair amplifier may be included. Thus, each gain cell 120 may have four transistors, two per differential pair. The output of each connects to an inductor 148 as shown and has its own parasitic capacitance, shown as capacitor 136. This arrangement would repeat for each of the four shown gain cell stages 120, or for any number of stages.

In one exemplary implementation, the gain cell includes at least two stages of amplification, such as two cascaded differential amplifiers. This arrangement is useful to maintain stability of the laser driver because it improves isolation between input and outputs of the gain stages, particularly in silicon technologies which are not as good at isolation as compared to other technologies. This configuration also reduces or eliminates oscillation. The two gain stage cells provide good isolation without wasting voltage output dynamic (that is a critical specification for laser driver), as opposed to a single gain stage with cascoded output. By spreading the driver system (amplifier) across several stages or cells, the isolation is increased, as compared to if each gain cell was a single amplifier. Failure to provide enough isolation between input and output of the gain cell may create instability in the system and lead to oscillations. In addition, by establishing a distributed system, the capacitance is spread between stages, which in addition to the inductors, reduces capacitances and allows the values of the inductors associated with the gain cells to be selected to provide impedance matching to the output load. Stated another way, by spreading the capacitance in the gains cells as shown, the capacitance essentially disappears.

The inductance is in or part of the core of the amplifiers. The inductors combined with the parasitic capacitor form a transmission line over which the signal propagates. The gain cells (with its parasitic capacitors) and inductors appear as gain stages connected by a transmission line.

Figure 3:
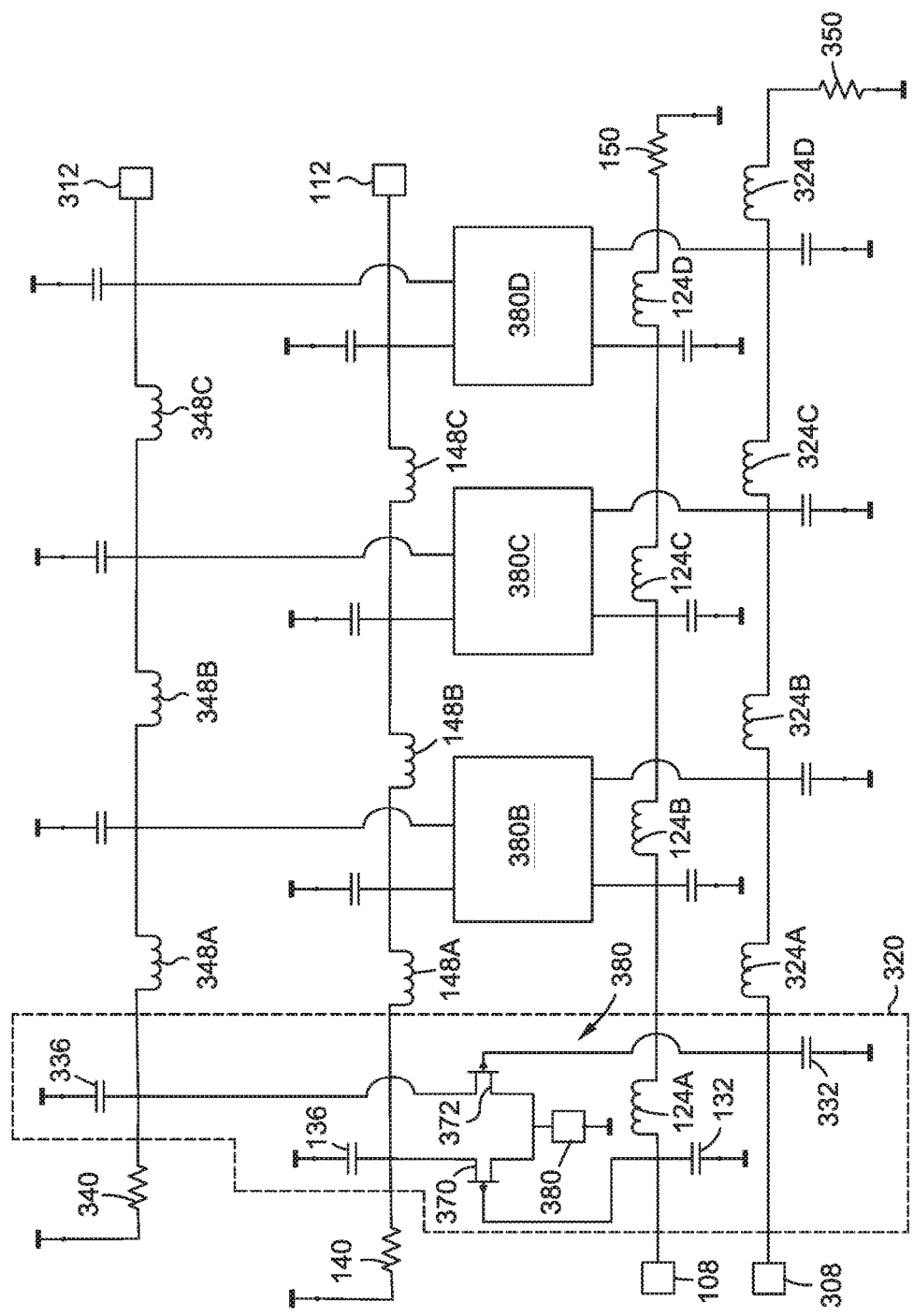
FIG. 3 illustrates an example embodiment of a distributed driver arranged in a differential pair configuration.

FIG. 3 illustrates an example embodiment of a distributed driver arranged in a differential pair configuration. In relation to FIG. 1, similar elements are labeled with identical reference numbers. Elements previously described are not described again. In this embodiment, the distributed amplifiers are configured as a differential pair. A pair of FET device 370, 372 are arranged as shown with a current source 380 or path located below the FET device 370. Operation of this circuit configuration is known in the art and not described herein. Parasitic capacitance 332, 336 is also shown. More than one differential pair may be provided in each cell 320. Additional differential pairs 380B, 380C, and 380D are also provided as shown in blocks.

Additional inductors 324A, 324B, 324C and 324D are provide and associated with the second leg of the differential pair along the input path at the bottom of FIG. 3. Additional inductors 348A, 348B, 324C and 348D are provide and associated with the second leg of the differential pair along the output path at the top of FIG. 3. Similarly, termination resistor 340 and 350 are arranged as shown in the second leg of the differential pair. Resistor 340 is the termination resistor of the output, while resistor 350 is the termination resistor of the input. Operation and function is generally similar to the embodiment shown in FIG. 1, with the differential signal provided on input nodes 108 and 308. Output nodes 112 and 312 provide a differential signal to an optic signal driver.

Figure 4:
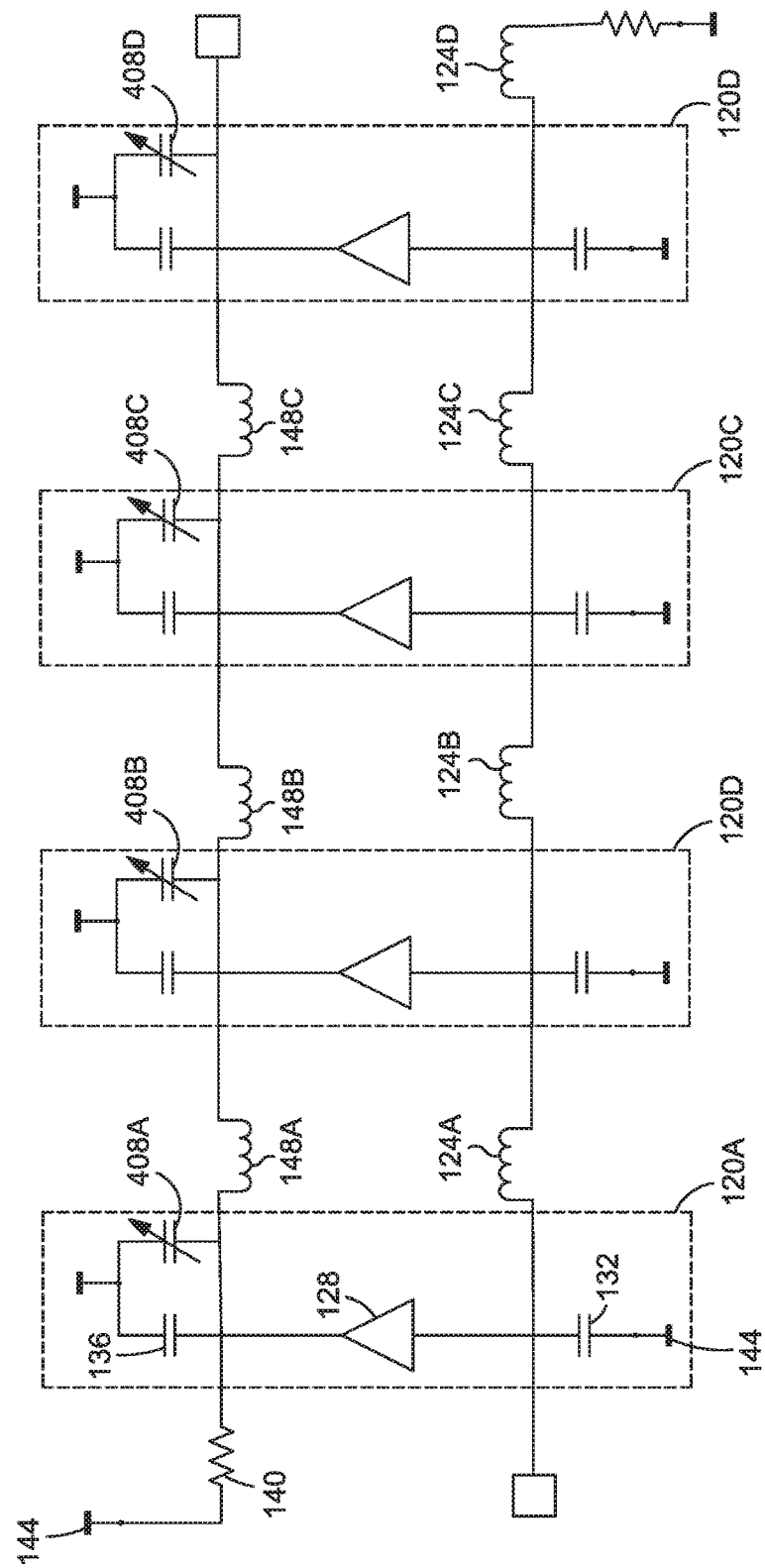
FIG. 4 illustrates a block diagram of a variable capacitor in association with each or one or more gain cell in a single ended embodiment.

FIG. 4 illustrates a block diagram of a variable capacitor in association with one or more gain cell in a single ended embodiment. In this embodiment, illustrated elements which are similar to the elements of FIG. 1 are labeled with identical reference numbers. The discussion of FIG. 1 is repeated and incorporated for FIG. 4. As shown, a variable capacitor 408A is associated with the first cell 120A to allow a user, designer, system, or any other mechanism to adjust the capacitance associated with a cell. The variable capacitor 408A may be any type capacitor or any other element capable of adjusting capacitance as described herein or known in the art. The other cells 120 likewise have variable capacitors 408B, 408C, 408D as shown. The variable capacitor can account for changes in the circuit or optic signal generator that occurs over time, from device manufacturer to device manufacture, or from one device production run to the next, which may have different or changing capacitance levels.

Figure 5:
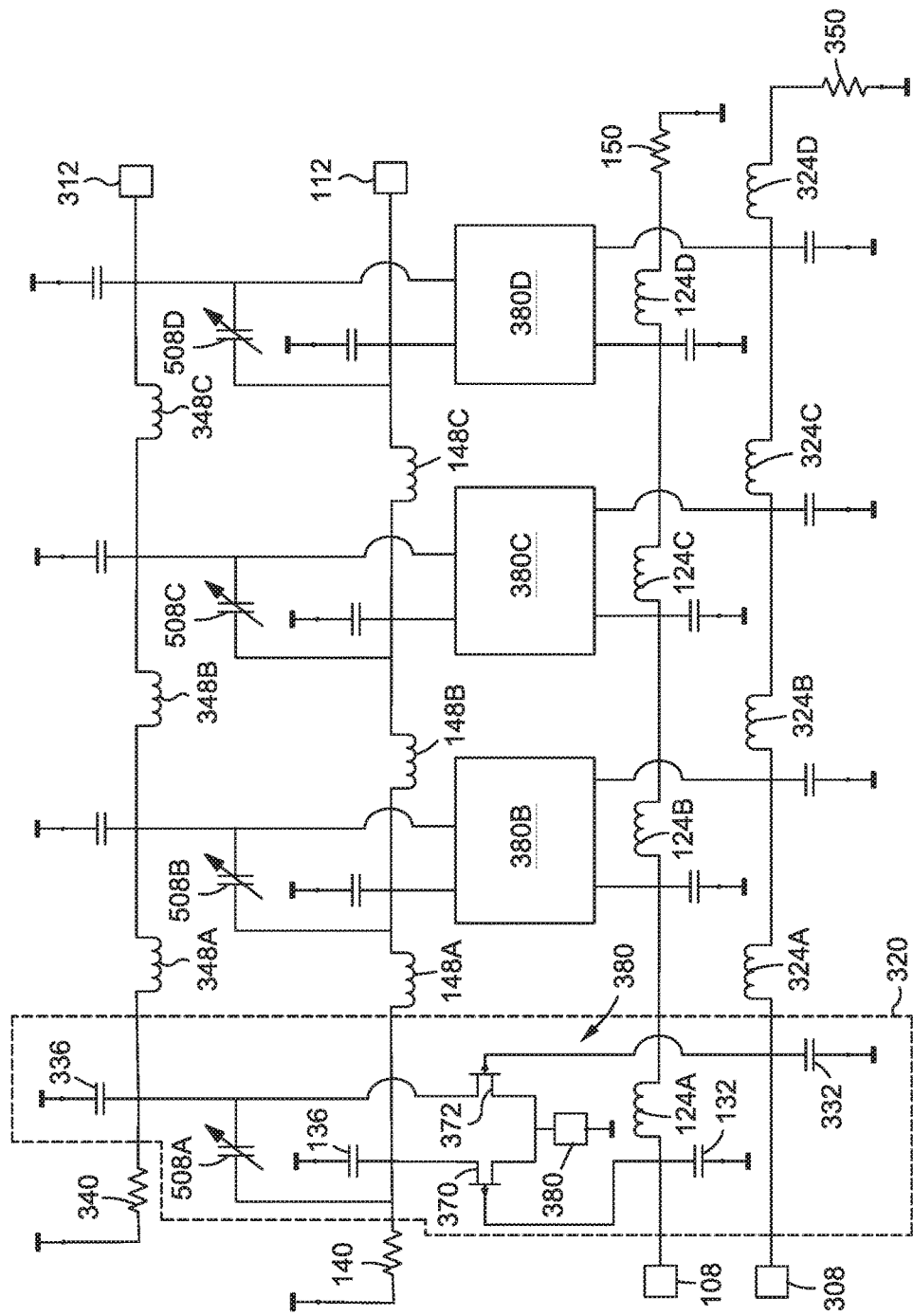
FIG. 5 illustrates a block diagram of a variable capacitor in association with each or one or more gain cell in a differential embodiment.

FIG. 5 illustrates a block diagram of a variable capacitor in association with one or more gain cells in a differential configuration. In the differential arrangement shown in FIG. 5, a variable capacitor 508A, 508B, 508C and 508D is connected between the amplifier outputs for each stage 120, or only certain stages. For both FIGS. 4 and 5, the programmable/variable capacitor 508 can be connected to the input or output of each gain cell 120 to tune the characteristic impedance of the artificial transmission line created by the inductors/transmission line and the gain cells. An example of programmable/variable capacitor could be a varactor or an array of parallel capacitors, each one in series with a switch (MOS switch). Any element may be used that will controllably change or adjust the capacitance. The capacitor 508 may be used in a single ended (FIG. 4) or differential arrangement (FIG. 5). If the output of the gain cell 120 is differential, the programmable/variable capacitor 508 can be placed across the two differential outputs saving area and reducing the parasitic elements. Control signals for the variable capacitor may be provided during manufacture (production testing), configuration, or at any time by a user after system level testing. Feedback control of the capacitance or table look up is also contemplated to dynamically account for system changes and aging. For example the quality of the signal (eye diagram) could be measured externally and a microcontroller could adjust the setting to optimize it.

It is also contemplated that an exemplary circuit level configuration of a variable capacitance system utilizes multiple branches of transistors configured as switches in series with different value capacitors. The control of the switches occurs by forcing the gate of the transistors to a voltage corresponding to the on state for the transistor and by adjusting the source and drain voltage through high value resistors in such a way that the switches would be turned on or off depending on the voltage at the source and drain Controlling the on and off switching of the transistors in turn adjusts the capacitance because the transistors will connector more or fewer capacitors to the output path. This adjusts the amount of variable capacitance in the output pair in the differential pair configuration where the structure described is connected between the differential pair output. In a single ended configuration, the variable capacitance is established between output and ground. The high value series resistance used to control the source and drain voltage reduces the parasitic capacitance when the transistor (switch) is off as compared to transistors which are controlled by a gate voltage. This is but one possible arrangement of circuitry.

Use of variable capacitance allows the distributed amplifier (driver) to be capacitance tuned. For example, if during manufacturing the capacitance changes from that expected, the capacitance may be adjusted using one or more variable capacitors. Likewise, laser capacitance may vary from one manufacturing run to the next or if the laser changes from original design or based on the load in general. In one example embodiment, a programmable or variable capacitor is implemented using a 3 bit programmable, NMOS switch in a differential configuration.

Figure 6:
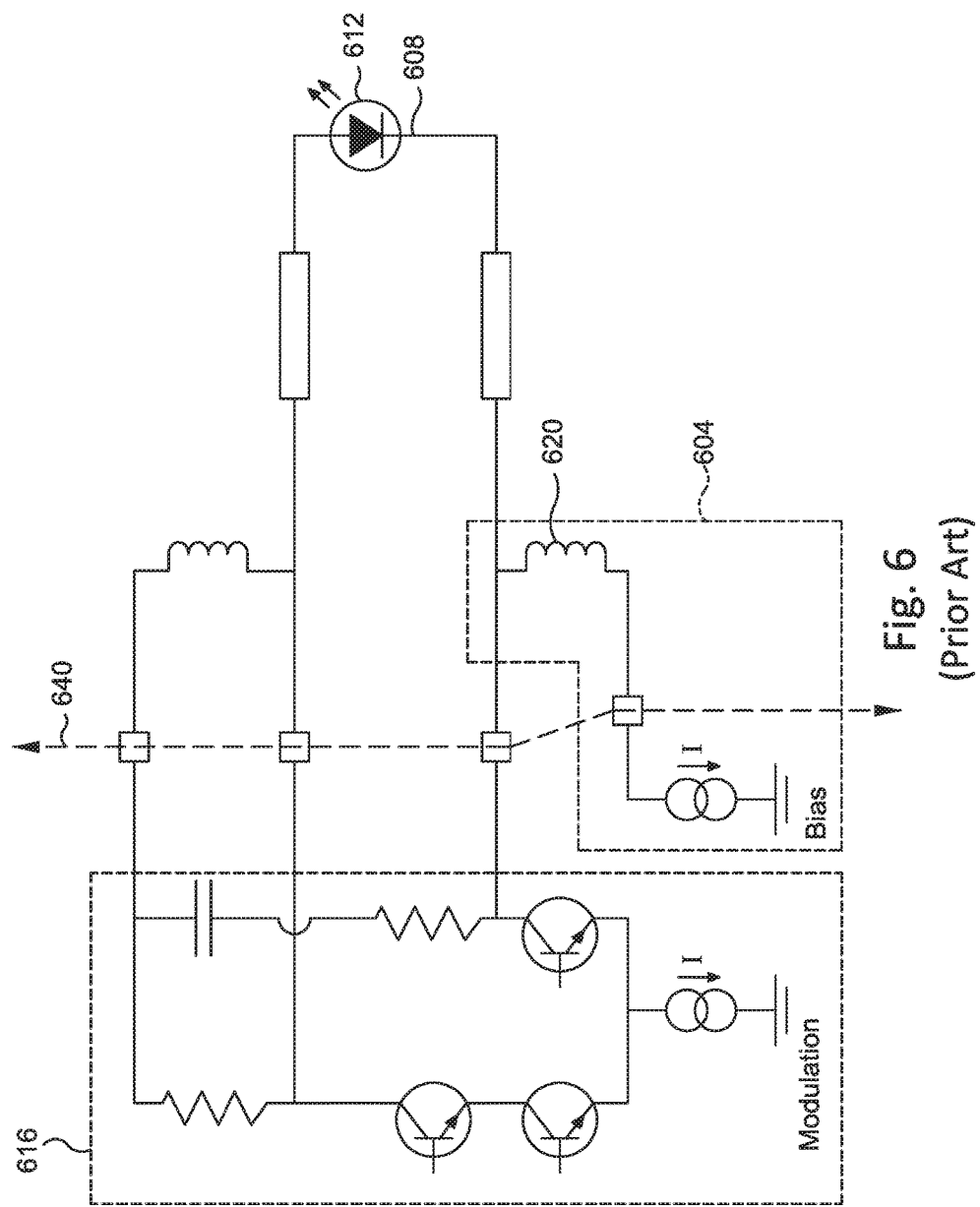
FIG. 6 illustrates a prior art bias circuit.

Also disclosed herein is a optical signal generator driver that includes an improved bias circuit. FIG. 6 illustrates a prior art bias circuit. This prior art driver includes a bias circuit 604 that is connected to the cathode 608 of the laser 612 and provides DC current to bias the laser. A modulation driver circuit 616 is also shown. Demarcation line 640 defines the separate between the integrated circuit (chip) and the circuit board. Thus, the inductor 620 and laser 612 are located on the circuit board. The bias circuit 604 usually has a large parasitic output capacitance that has to be isolated from the output node (laser cathode 608) using an external ferrite/inductor 620, otherwise it will negatively impact the high-speed performance. This external ferrite/inductor 620 is unwanted because it is large, costly, and difficult to place on a circuit board on which the bias circuit 604 resides.

Figure 7:
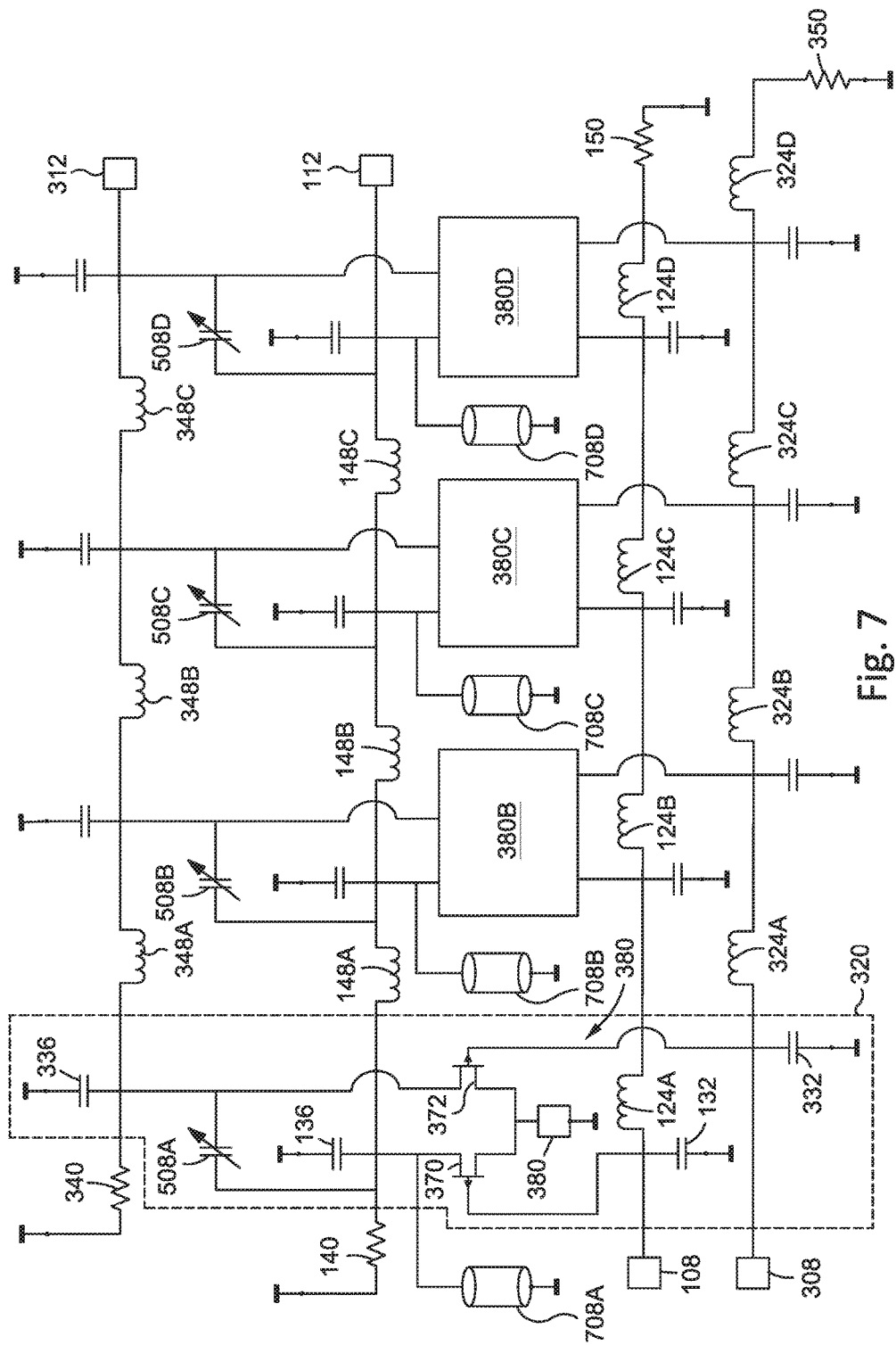
FIG. 7 illustrates an example embodiment of a driver circuit with distributed bias circuit.

FIG. 7 illustrates an example embodiment of a driver with distributed bias circuit which allows for elimination or reduction in size (to a value that can be integrated) of the ferrite 620 shown in FIG. 6. Although shown in a differential pair configuration, it is contemplated that the bias circuit may be distributed in a single ended circuit configuration. As compared to FIGS. 3 and 5, similar elements are labeled with identical reference numbers. Added to FIG. 7 are distributed circuits 708A, 708B, 708C and 708D (collectively 708). Thus, just as the driver cells are distributed so too are the bias circuits 708. By distributing the bias circuits 708, the large parasitic capacitance of the bias circuit is also distributed. As a result, the large parasitic capacitance of the bias circuit is spread into two or more small parasitic capacitances and as such the parasitic capacitance may be cancelled with the inductors 324, 348, that is part of the driver cells, either as part of the transmission line inductance or added inductors. This reduces or eliminates the need for a large, off chip, on board inductors which increases costs, space requirements, and complexity.

Stated another way, the proposed solution split the bias circuit in several cells or circuits, called bias circuits 708A, 708B, 708C, 708D. The bias circuit 708 connects to the output node of a gain cell 320. In this arrangement, the capacitance of the bias circuit 708 is absorbed into the artificial transmission line (which has inductance) that connects the driver cells 320 and there is no need for an external ferrite/inductor for capacitance isolation. It is contemplated that each gain cell or stage would include a bias circuit. However, in other embodiments, a fewer number than all the driver cells 320 may be configured with bias circuits 708. Moreover, this implementation allows the implementation of the driver with one less pin potentially allowing for a smaller, less expensive package.

Figure 8:
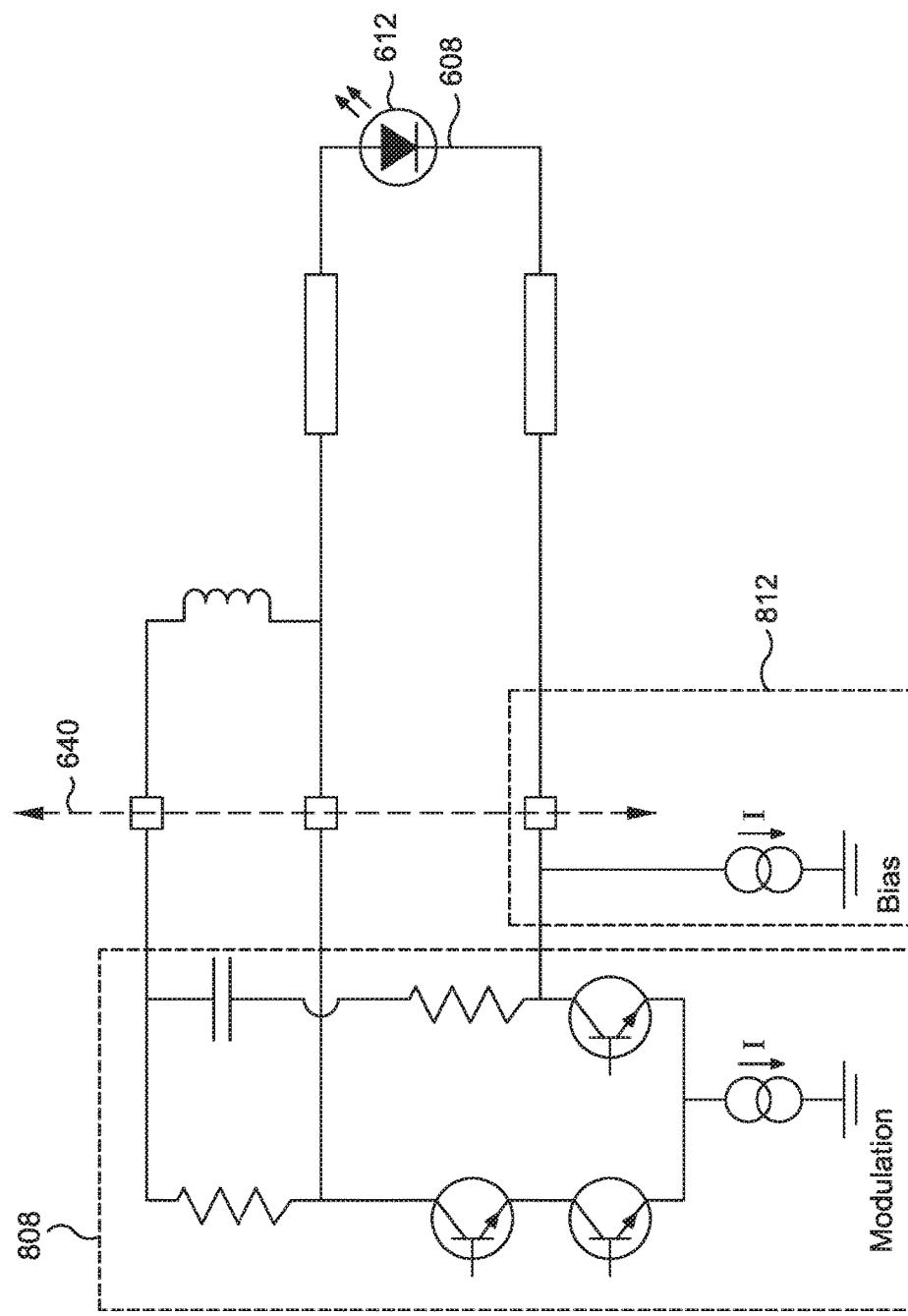
FIG. 8 illustrates an example embodiment of the bias circuit suitable for inclusion with the circuit of FIG. 7.

FIG. 8 illustrates an example embodiment of the bias circuit suitable for inclusion with the circuit of FIG. 7. This is but one possible embodiment of a bias circuit and one of ordinary skill in the art may arrive at other embodiments without departing from the scope of the claims that follow. As shown, the bias cell 812 is located between the laser 612 and the driver cell 808 and connects to the cathode 608 of the laser. The bias cell 812 biases the laser as is understood in the art. By utilizing the combined inductance of the conductive path defined herein as the transmission line and/or flex between the driver cell 808 and the laser 612, the requirement of the large external inductor is eliminated or reduced. While this configuration may not be suitable for a single driver cell, when the driver functions are distributed across multiple cells as shown and described above, the bias cell 812 may likewise be distributed and the inductance from the transmission line between the driver cells and the laser reduces the need for an inductor or eliminates the need for the inductor. By distributing biasing into the gain cell, the large ferrite inductance of the prior art is not needed. As can be seen in FIG. 8, this configuration also has the benefit of reducing the required pin count on an integrated circuit package due to the elimination of the pin that would connect to the external ferrite (inductor).

FIG. 9 illustrates an example environment of use of the distributed driver disclosed herein. This is but one possible embodiment and it is contemplated and understood that the innovation disclosed herein may be used in other environments than disclosed below. As shown, an exemplary optic signal transmitter 904 includes a data source 908 that provides data for transmission as an optic signal. The data source 908 may be another system or device, either on chip, or off chip, or a memory. The data source 908 provides the data to a driver and biasing module 912. The driver and biasing module 912 prepares the data for transmission as an optic signal and amplifies the signal to a level suitable for transmission by an optic signal generator 916. In this embodiment, the driver and biasing module 912 is configured as a distributed driver as described above with optional distributed biasing.

The output of the driver and biasing module 912 provides the amplified signal (with biasing) to the optic signal generator 916, such as a laser, or any other type device capable of generating an optic signal for transmission over a fiber optic cable or other optic signal carrying medium. Optical signal generators that may be used with the driver disclosed herein are: direct modulated lasers (DMLs), EMLs (Electroabsorptive Modulated Lasers), VCSELs (Vertical Cavity Surface Emitting Lasers), LEDs (Light Emitting diodes), PICs (photonic integrated circuits) and other optical modulators The generated optic signal is provided to a fiber optic cable 920, which carries the optic signal to a remotely located receiver 924.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A distributed driver for an optic signal generator comprising:
   two or more amplifier cells having:
      an amplifier cell input configured to receive the input signal;
      one or more amplifiers configured to amplify the received signal to create an amplified signal;
      an amplifier cell output;
   an input path connected to the amplifier cell input to receive the input signal and distribute the input signal to the two or more amplifier cells, the input path including one or more inductors that cancel parasitic capacitance from the two or more amplifier cells;
   an output path connected to the amplifier cell output of the two or more amplifier cells to receive the amplified signal, the output path including one or more inductors that cancel parasitic capacitance from the two or more amplifier cells; and
   a biasing cell connected to each amplifier cell, the biasing cell distributing a biasing cell capacitance to each amplifier cell so that the one or more inductors can cancel the biasing cell capacitance.

2. The distributed driver of claim 1 wherein an inductor from the input path and an inductor from the output path is associated with each amplifier cell.

3. The distributed driver of claim 1 wherein the combination of the amplifier parasitic capacitance and the inductors in the input path and the output path form a transmission line that tunes out the parasitic capacitance from the two or more amplifiers.

4. The distributed driver of claim 1 further comprising a variable capacitor that is part of one or more amplifier cells, the variable capacitor configured to tune the capacitance of one or more amplifier cells to optimize output return loss.

5. A distributed driver for an optic signal generator comprising:
   a driver input configured to receive an input signal;
   an output configured to provide an output signal to the optic signal generator;
   a first amplifier cell comprising a first amplifier cell input, one or more amplifiers, and a first amplifier cell output, the first amplifier cell configured to receive and amplify the input signal to create a first amplified signal on the first amplifier cell output;
   a second amplifier cell comprising a second amplifier cell input, one or more amplifiers, and a second amplifier cell output, the second amplifier cell configured to receive and amplify the input signal to create a second amplified signal on the second amplifier cell output;
   a first conductive path connecting the driver input to the first amplifier cell input and the second amplifier cell input, the first conductive path carrying the input signal to the first amplifier cell and the second amplifier cell such that an inductance of the first conductive path counteracts a capacitance associated with the first amplifier cell and the second amplifier cell;
   a second conductive path connecting the driver output to the first amplifier cell output and the second amplifier cell output, the second conductive path carrying the first amplified signal and the second amplifier signal to the driver output, such that an inductance of the second conductive path counteracts the capacitance associated with the first amplifier cell and the second amplifier cell;
   a first variable capacitor in the first amplifier cell configured to selectively tune the capacitance of the first amplifier cell;
   a second variable capacitor in the second amplifier cell configured to selectively tune the capacitance of the second amplifier cell;
   a first bias cell connected to the first amplifier cell, the first bias cell configured to bias the optic signal generator, wherein the inductance of the first conductive path is configured to cancel parasitic capacitance of the first bias cell; and
   a second bias cell connected to the second amplifier cell, the second bias cell configured to bias the optic signal generator, wherein the inductance of the second conductive path is configured to cancel parasitic capacitance of the second bias cell.

6. The distributed driver of claim 5 wherein the first conductive path includes one or more inductors and the second conductive path includes one or more inductors.

7. The distributed driver of claim 5 wherein the distributed driver is configured as a differential pair.

8. The distributed driver of claim 5 further comprising additional amplifiers cells having a configuration that is the same as the first amplifier cell and the second amplifier cell.

9. The distributed driver of claim 5 further comprising one or more termination resistors connected to the first conductive path and one or more termination resistors connected to the second conductive path.

10. The distributed driver of claim 5 wherein the first bias cell and the second bias cell do not include or require an inductor located on a circuit board.

11. A distributed driver for an optic signal generator comprising:
    an driver input configured to receive an input signal;
    an output configured to provide an output signal to the optic signal generator;
    a first amplifier cell configured to receive and amplify the input signal to create a first amplified signal;
    a second amplifier cell configured to receive and amplify the input signal to create a second amplified signal;
    a first conductive path connecting the driver input to the first amplifier cell and the second amplifier cell, the first conductive path carrying the input signal to the first amplifier cell and the second amplifier cell, such that an inductance associated with the first conductive path counteracts a capacitance associated with the first amplifier cell and the second amplifier cell;
    a second conductive path connecting the driver output to the first amplifier cell output and the second amplifier cell output, the second conductive path carrying the first amplified signal and the second amplified signal to the driver output, such that an inductance associated with the second conductive path counteracts the capacitance associated with the first amplifier cell and the second amplifier cell; and
    a first bias cell connected to the first amplifier cell, the first bias cell configured to bias the optic signal generator and a second bias cell connected to the second amplifier cell, the second bias cell configured to bias the optic signal generator.

12. The distributed driver of claim 11 wherein the first conductive path includes one or more inductors and the second conductive path includes one or more inductors.

13. The distributed driver of claim 11 wherein the distributed driver is configured as a differential pair.

14. The distributed driver of claim 11 further comprising a first variable capacitor in the first amplifier cell configured to selectively tune the capacitance of the first amplifier cell and a second variable capacitor in the second amplifier cell configured to selectively tune the capacitance of the second amplifier cell.

15. The distributed driver of claim 11 further comprising additional amplifier cells.

16. The distributed driver of claim 11 further comprising one or more termination resistors connected to the first conductive path and one or more termination resistors connected to the second conductive path.

17. The distributed driver of claim 11 wherein the first bias cell and the second bias cell do not have an inductor located on a circuit board.

18. The distributed driver of claim 11 wherein the optic signal generator is a direct modulated laser.

19. A method for amplifying, with a distributed amplifier, an input signal for driving an optic signal generator, the method comprising:
    receiving the input signal, the input signal to be transmitted on an optic fiber as an optic signal;
    distributing the input signal to two or more amplifier cells over an input path having an inductance, the input path having an inductance that cancels a parasitic capacitance of the two or more amplifier cells;
    biasing the optic signal generator with two or more bias cells which are distributed such that two or more amplifier cells have bias cells associated therewith;
    amplifying the input signal with the two or more amplifier cells to generate amplified output signals;
    combining the amplified output signals from the two or more amplifiers on an output path, the output path having an inductance that cancels a parasitic capacitance of the two or more amplifier cells; and
    presenting the amplified output signal on an output from the distributed amplifier, the output connected to the output path.

20. The method of claim 19 wherein biasing the optic signal generator occurs without use of an inductor located on a circuit board.

21. The method of claim 19 wherein biasing the optic signal generator distributes bias cell capacitance associated with the two or more bias cells to the two or more amplifiers cells and the bias cell capacitance is cancelled by the input path inductance and the output path inductance.

22. The method of claim 19 further comprising adding a variable amount of capacitance to at least one of the two or more amplifier cells.

* * * * *